United States Patent [19]

Nakabayashi

[11] Patent Number: 4,899,353
[45] Date of Patent: Feb. 6, 1990

[54] INITIAL VALUE SETTING SYSTEM FOR ELECTRONIC DEVICE

[75] Inventor: Yasushi Nakabayashi, Tokyo, Japan
[73] Assignee: Seiko Instruments Inc., Tokyo, Japan
[21] Appl. No.: 124,877
[22] Filed: Nov. 24, 1987
[30] Foreign Application Priority Data Nov. 27, 1986 [JP] Japan .............................. 61-282289

[51] Int. Cl.[4] .......................................... H03K 21/40
[52] U.S. Cl. ....................................... 377/28; 377/39
[58] Field of Search .................................. 377/28, 39

[56] References Cited

U.S. PATENT DOCUMENTS

| | | | |
|---|---|---|---|
| 4,080,589 | 3/1978 | Kline | 377/28 |
| 4,363,123 | 12/1982 | Grover | 377/28 |
| 4,468,796 | 8/1984 | Suga | 377/28 |
| 4,669,098 | 5/1987 | Boatwright | 377/28 |

Primary Examiner—John S. Heyman
Attorney, Agent, or Firm—Bruce L. Adams; Van C. Wilks

[57] ABSTRACT

An initial value setting system for an electronic device having system clearing means for generating a trigger pulse in response to power source voltage fluctuation, counter means for counting intervals between the trigger pulses generated successively by the system clearing means, and initial value setting means for undergoing an initialize operation of the electronic device in response to the counter means. In accordance with the present invention, an erroneous execution of all-clear due to electrostatic disturbance noise can be prevented by counting interval or number of the trigger pulses, and discriminating whether or not the initial value setting means should be operated.

2 Claims, 4 Drawing Sheets

INITIAL VALUE SETTING SYSTEM FOR ELECTRONIC DEVICE

BACKGROUND OF THE INVENTION

1. Field of the Invention

The invention relates to means which set an initial value for an electronic device comprising a RAM which stores information such as time data or others, a ROM which stores the program of an operation process for various functions, and LSI composed of a CPU for logical operation.

2. Description of the Prior Art

Various countermeasures to prevent malfunctioning of an electronic device by external disturbance noises, such as power source fluctuation, have been adapted to the conventional electronic apparatus employing C-MOS LSI: that is, in order to absorb surge-noise generated in a power source, a large capacitance is connected in a row with power source batteries; and in order to absorb disturbance noise, the relation of positions between respective input/output terminals and power source on the above LSI are regulated, and capacitance elements are added between said input/output terminals and power source.

When power is turned on, it is necessary to set an initial value in order to operate electronic equipment employing LSIs which are constructed with ROM, RAM and CPU. In the operation for setting an initial value of electronic timepieces, for example, by storing data of initial values such as counting and storing functions for the time or others as the procedure for setting an initial value in a ROM which stores the program for operation procedure of various functions, and by executing the operation of an initial value setting means, the data of various functions stored in a RAM are initialized. Therefore, the conventional electric device had a defect of causing an erroneous operation of all-clear during normal operation when the above initial value setting means is operated by disturbance noise. In addition, since it is only to decrease power source noise generated by disturbance noises in the case of the abovementioned countermeasures employed in the prior art, such countermeasures could not work effectively.

As one of the examples with respect to said disturbance noises, a well-known operation of a power-on clear circuit during power source change will now be described. FIG. 2 shows the most typical example of a power-on clear circuit which is one element of the system clear means 9 shown in FIG. 1. The power-on clear circuit of FIG. 2 comprises a resistor R composed of PchTr 10 which joins a source to Vdd and a gate to Vss respectively. A condenser 11 is connected in series with the resistor R, and an inverter (INV) 12 is connected to the middle point "a" between said C and R. FIG. 3 is a time chart which shows that a pulse is generated by the Power-on Clear Circuit when Vdd is changed by a disturbance noise. Waveforms at points "a" and "b" exist in response to changes in the power source (indicated by dashed line) on the power-on clear circuit shown in FIG. 2. A dash and dotted line in FIG. 3 indicates changes of the threshold voltage VTH (VTH=VDD/2) of the inverter INV 12 when changes occur in the power source. When the power is inputted or changed, the waveform at the middle point "a" between the condenser C 11 and the resistance R 10 connected in series becomes a differential waveform as shown in a solid line in FIG. 3 due to the charging characteristics of the condenser. Since the $V_{TH}$ of INV 12 changes according to changes in the power source, the INV 12 outputs $V_{DD}$ a signal to the point "b" in case the output at point "a" is below the $V_{TH}$. This signal at the point "b" results in all-clear.

SUMMARY OF THE INVENTION

It is, therefore, an object of the present invention to provide an initial value setting system which is capable of preventing an erroneous execution of all-clear.

This invention employs a means to determine whether or not the means for setting an initial value should be run. Therefore, if electrostatic disturbance noise is generated under normal operating conditions, the means for setting an initial value is not driven and an erroneous operation of all-clear can be prevented previously.

DETAILED DESCRIPTION OF THE PREFERRED EMBODIMENT

Figure 1:
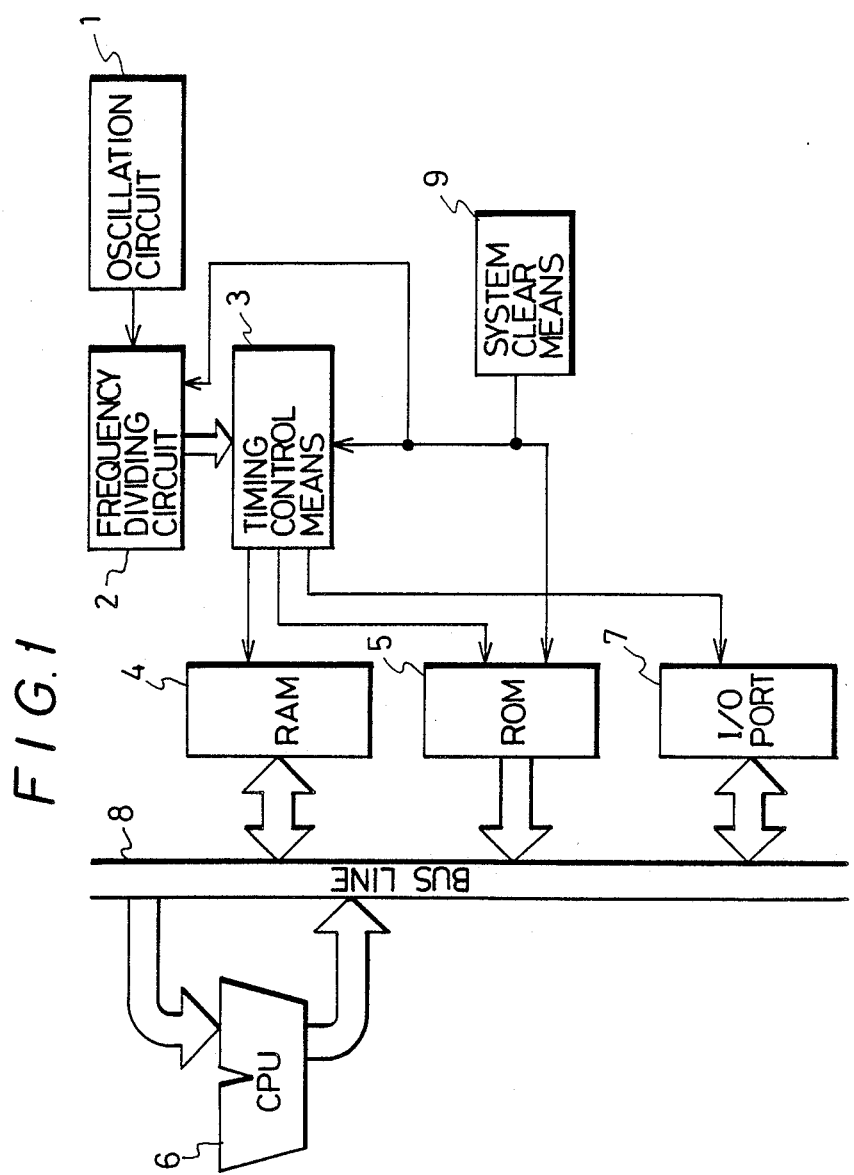
FIG. 1 is a block diagram illustrating an embodiment for the initial value setting procedure of the present invention.
Figure 2:
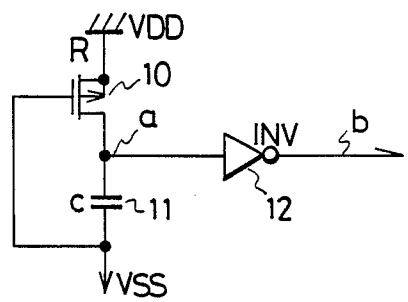
FIG. 2 is a diagram illustrating one example of power-on clear circuit.
Figure 3:
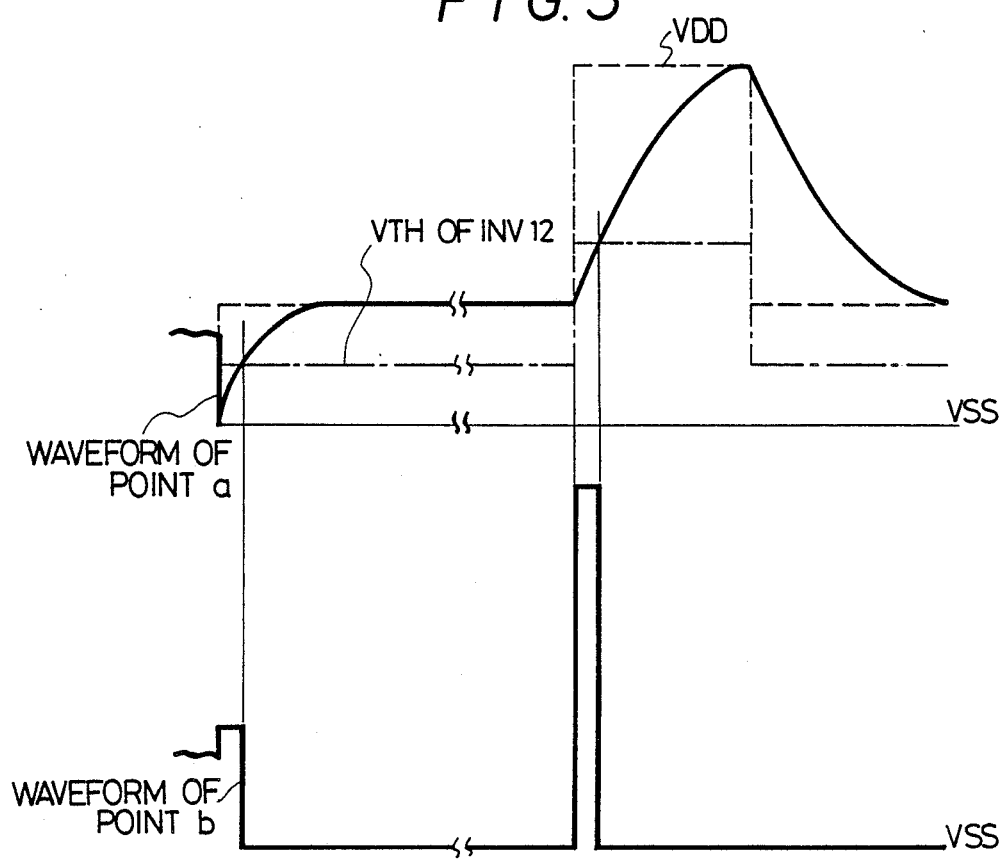
FIG. 3 is a timing chart in for the circuit of FIG. 2.
Figure 4:
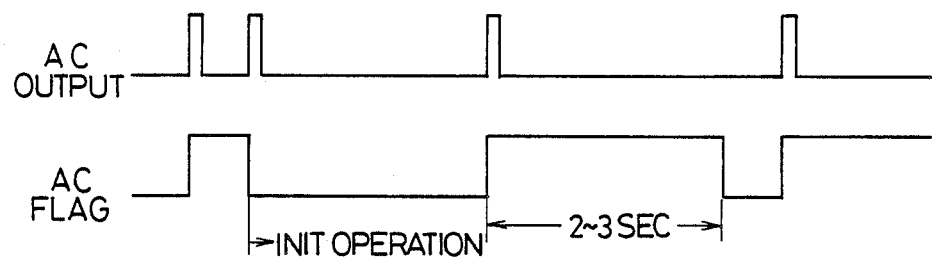
FIG. 4 is a timing chart for an embodiment of the present invention.
Figure 5:
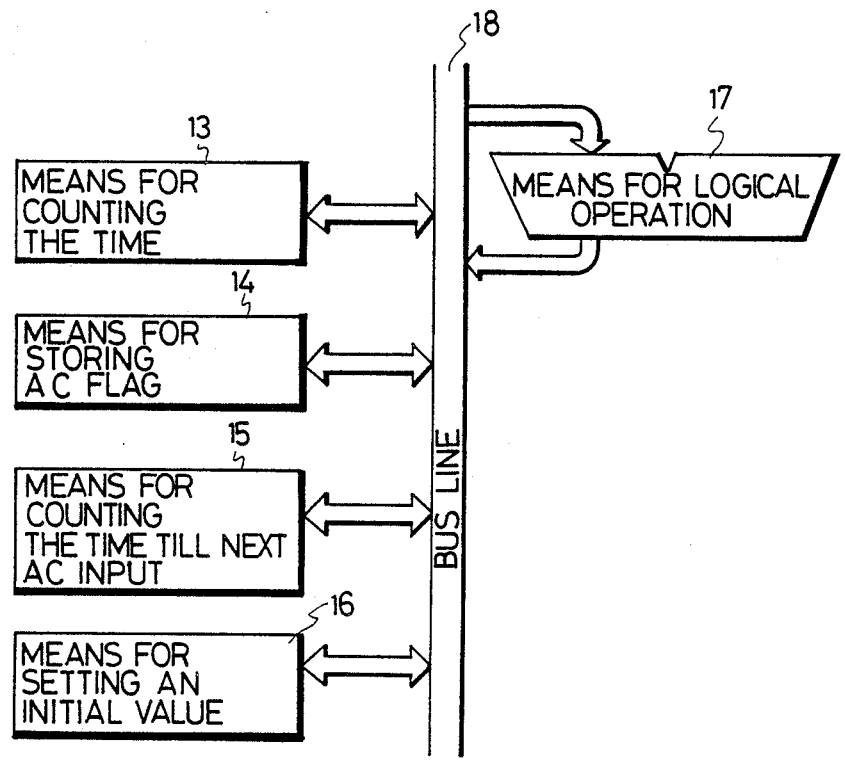
FIG. 5 is a detailed block diagram illustrating the functions of the CPU 6 of FIG. 1.
Figure 6:
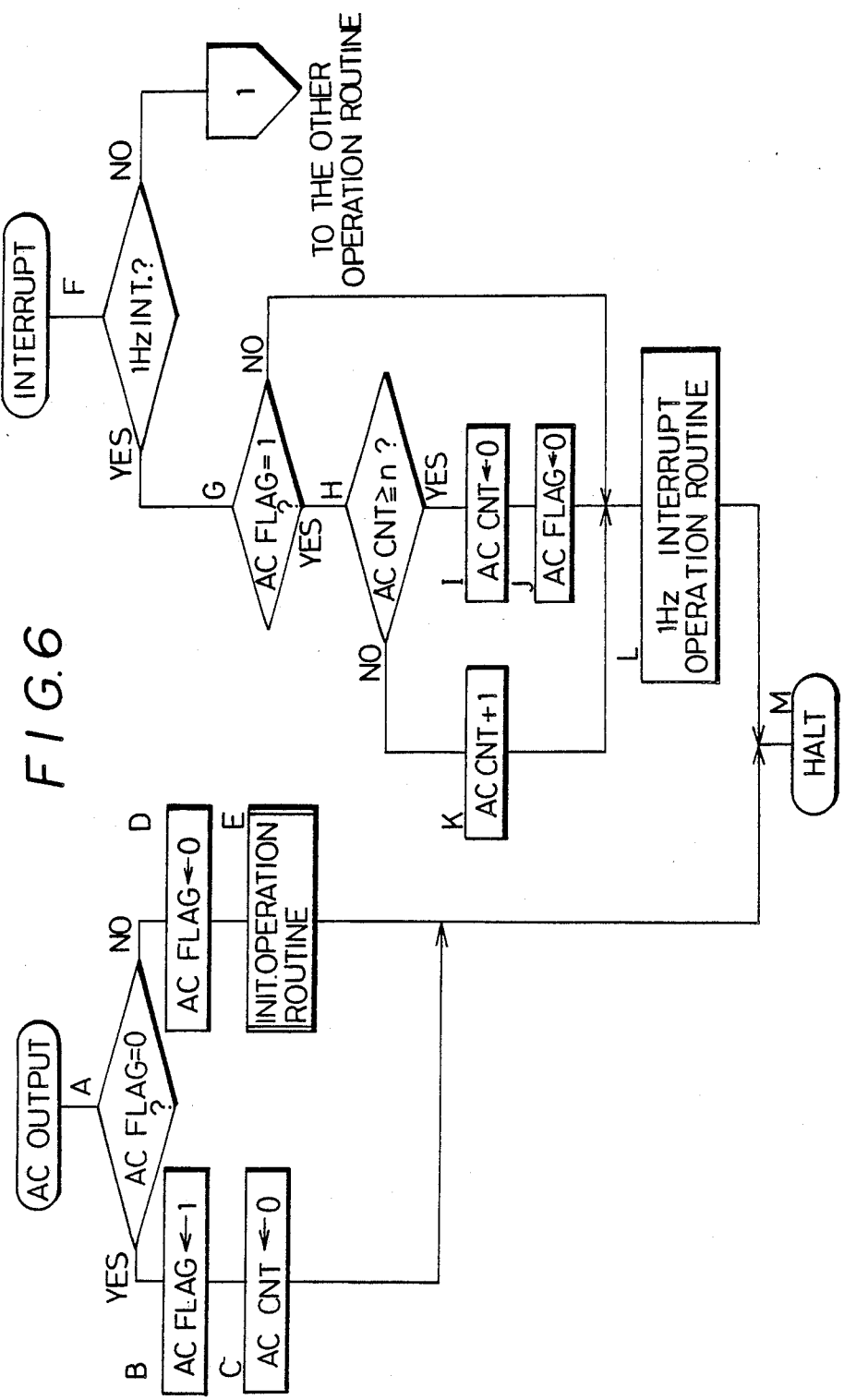
FIG. 6 is a flow chart of the logical operation executed by the CPU 6 of FIG. 1.

Hereafter, the invention will be described with reference to embodiments shown in the accompanying drawings. FIG. 1 is a block diagram defining an embodiment of the present invention as an electronic timepiece: 1 denotes an oscillation circuit employing a quartz oscillator as a source of oscillation; 2 denotes a frequency-dividing circuit which divides the frequency of outputs of the oscillation circuit 1; reference numeral 3 denotes a timing-control means which forms and produces timing clock necessary for operating the whole system in response to a plurality of outputs from the frequency-dividing circuit 2; reference numeral 4 denotes a RAM which counts and stores a plurality of time and function data; reference numeral 5 denotes a ROM which stores the instructions in that the operation procedure of a plurality of time and function data is programmed therein; reference numeral 6 denotes a CPU for performing arithmetical and logical operations; reference numeral 7 denotes an I/O port which inputs an external switch and outputs time display; reference numeral 8 denotes a bus line for transferring data; and reference numeral 9 denotes a system clear means which generates a signal for initializing the condition of the respective means. FIG. 4 is a time chart indicating an embodiment of the present invention, FIG. 5 is a block diagram indicating in detail the area of CPU 6 in FIG. 1, FIG. 6 is a flow-chart of the operation which is executed by CPU 6 shown in FIG. 1. The instructions generated by the system whose operation is depicted by the flowchart of FIG. 6 is programmed and stored in ROM 5 shown in FIG. 1.

The CPU 6 of FIG. 1, as shown in FIG. 5, comprises a means 13 for counting the time, a means 14 for storing an AC flag, a means 15 for counting the time till next inputs of AC, a means 16 for setting an initial value, or initial values, and a means 17 for performing the logical operation. The foregoing respective means are connected via the bus-line 18.

The operation of the thus constructed embodiment will now be described. The output signal of the system clear means 9 of FIG. 1 is indicated on the time-chart of FIG. 4 as AC Output. When an AC Output is generated, the data of the means 14 which stores the AC flag is interrogated via the bus line 18, by the means 17 for logical operation, which determines whether the flag data is "0" or "1". When the flag data is "0", the data is changed to "1" and is again written, via the bus line 18, to the means 14 which stores the AC flag. Subsequently, the data of the means 15, which counts the time till next AC Output signal, is read via the bus line 18 by the means 17 for logical operation, and the data is changed to "0" and is again written to the means 15 which counts the time till next AC Output signal. When the interrogated flag data is determined to be "1" by the means 17 for logical operation, the data of "0" is written via the bus line 18 to the means 14 which stores the AC flag and according to the data of the means 16, initial value is set over the entire system, via the bus line 18.

A signal formed by the timing control means 3 shown in FIG. 1 gives an instruction to the system, via I/O port 7, to start an operation (generally called as "interrupt"). When the above interrupt is 1 Hz, the data of the means 14 which stores AC flag is interrogated by the means 17 for logical operation, and determined to be "0" or "1". In case of "0", the system is generally operated with 1 Hz interrupt execution. In case of "1", the data of the means 15 which counts the time till next AC Output is read via the bus line 18 by the means 17 for logical operation which determines whether the data is equal to or larger than a predetermined time duration "n". When the thus determined result is "NO", "1" is added to the data of the means 15 which counts the time till next AC Output and, via the bus line 18, is written to the means 15. When the determined result is "YES", the data of the means 15 which counts the time till next AC Output and the data of the means 14 which stores the AC flag are written to the respective means 14 and 15, as the value of "0", via the bus line 18. Afterward, thus written value is operated with interrupt execution such as the means 13 which counts the time, and the operation returns to HALT conditions.

FIG. 6 shows a flow chart for executing the above mentioned control operation, wherein symbols of A to M denote each step for execution in the flow chart.

The control operation employed in the present invention is executed when an AC inputs is generated due to disturbance noise or the like, or when interrupt occurs at intervals of 1 HZ. When an AC output occurs under interrupt-waiting state (hereinafter referred to as HALT), a step A determines if the AC flag is "0", at first. When the result is "YES", the program proceeds to a step B to set the AC flag. When the result is "NO", the program proceeds to a step D to reset the AC flag. The value of "1" is written to AC flag at the step B and, in a step C, the value of "0" is written to means 15 which counts the time till next AC input, and the operation returns to HALT conditions. The value of "0" is written to AC flag at the step D. The CPU recognizes an AC pulse as being the second pulse input during the predetermined time when the AC flag has been set. The CPU then executes the initial operation routine for setting an initial value at a step E, and the operation finally returns to HALT conditions. The left side of FIG. 4 shows the timing chart of this process.

In addition, an interrupt is inputted by 1 Hz timing under HALT conditions, and at step F it is determined whether it is the interrupt or not. When the result is "YES", the program proceeds to a step G. When the result is "NO", the program proceeds to the other operation routine. At step G it is determined whether or not AC flag is "1". When the result is "YES", the program proceeds to a step H and when the result is "NO", the program proceeds to the other step, a step L, which executes routine 1 HZ interrupt operation. The step H determines whether the data of the means 15 which counts the time till next AC input is larger than or equal to the value "n". When the result is "YES", the program proceeds to a step I and when the result is "NO", the program proceeds to a step K. The step I sets the data of the means 15, which counts the time spent till next AC input to "0", and also changes AC flag to "0". The step k adds "1" to the data of means 15 which counts the time spent till next AC input, the step L executes 1 HZ interrupt operation, and the program returns to HALT conditions. The right side of the timing chart of FIG. 4 shows this process.

According to the present invention as described above, when an electrostatic disturbance noise comes in, the system clear circuit begins to run due to surge voltage caused on power supply voltage. However, if an AC output is generated, the program is controlled not to execute the operation for setting an initial value. Therefore, the present invention has an effect to prevent an erroneous execution of all clear during the operation.

In addition, the embodiment adapts AC Flag with 1 bit of "0" or "1" but it is possible to prevent an erroneous operation caused by AC output which is successively produced, by increasing the number of the bits. The time duration counted till next AC input is specified as 2 to 3 seconds in FIG. 4. However, as the time duration can be described as "n" second such as done in the specification, it is also possible to change it to any desired value.

What is claimed is:
1. An initial value setting system for an electronic device comprising:
   means for generating a trigger pulse in response to each fluctuation in the voltage level of a power source for the device;
   means for determining the time interval between successive ones of said trigger pulses;
   means for providing a predetermined time interval including a timer responsive to a system clock;
   means for storing a first indication in the presence of said trigger pulse;
   means for starting said timer in response to said first indication;
   means for storing a replacement indication for said first indication when said timer times out; and
   means for actuating an initializing operation of the electronic device upon detection of said first indication when the time interval between successive ones of said trigger pulses is shorter than said predetermined time interval.

2. The initial value setting system of claim 1, in which said timer comprises a counter responsive to said system clock; storage means for storing a predetermined number; and means for comparing the content of said counter with the content of said storage means.

* * * * *